(12) United States Patent
Kobilka et al.

(10) Patent No.: US 9,944,747 B2
(45) Date of Patent: Apr. 17, 2018

(54) LADDER POLYBENZODIFURANS

(71) Applicant: International Business Machines Corporation, Armonk, NY (US)

(72) Inventors: Brandon M. Kobilka, Tucson, AZ (US); Jason T. Wertz, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 50 days.

(21) Appl. No.: 15/219,862

(22) Filed: Jul. 26, 2016

(65) Prior Publication Data

US 2017/0342203 A1  Nov. 30, 2017

Related U.S. Application Data

(63) Continuation of application No. 15/163,767, filed on May 25, 2016.

(51) Int. Cl.
| | | |
|---|---|---|
| *C08G 61/12* | (2006.01) | |
| *H01L 51/00* | (2006.01) | |
| *H01B 1/12* | (2006.01) | |
| *H01L 51/42* | (2006.01) | |

(52) U.S. Cl.
CPC ........... *C08G 61/125* (2013.01); *H01B 1/124* (2013.01); *H01L 51/0035* (2013.01); *H01L 51/0044* (2013.01); *H01L 51/0047* (2013.01); *C08G 2261/1336* (2013.01); *C08G 2261/18* (2013.01); *C08G 2261/3241* (2013.01); *C08G 2261/3242* (2013.01); *C08G 2261/41* (2013.01); *C08G 2261/51* (2013.01); *C08G 2261/91* (2013.01); *H01L 51/4253* (2013.01)

(58) Field of Classification Search
CPC .............. C08G 61/125; C08G 2261/18; C08G 2261/3242; C08G 2261/51; C08G 2261/91; H01L 51/0035; H01L 51/0044; H01L 51/0047; H01L 51/4253; H01B 1/124

See application file for complete search history.

(56) References Cited

U.S. PATENT DOCUMENTS

| | | |
|---|---|---|
| 8,427,812 B1 | 4/2013 | Stenger-Smith et al. |
| 8,723,163 B2 | 5/2014 | Uetani |
| 8,993,713 B1 | 3/2015 | Lai et al. |
| 9,000,449 B2 | 4/2015 | Fujioka et al. |
| 9,082,983 B1 | 7/2015 | Baca et al. |

(Continued)

FOREIGN PATENT DOCUMENTS

| | | |
|---|---|---|
| CN | 102408547 A | 4/2012 |
| CN | 102827355 A | 12/2012 |

(Continued)

OTHER PUBLICATIONS

Kobilka et al., "Synthesis of 3,7-diiodo-2,6-di(thiophen-2-yl)benzo[1,2-b:4,5-b0]difurans: functional building blocks for the design of new conjugated polymers," Chem. Commun., 2012, 48, 8919-8921.*

(Continued)

*Primary Examiner* — Mark Kopec
*Assistant Examiner* — Jaison P Thomas
(74) *Attorney, Agent, or Firm* — Roy R. Salvagio; Robert R. Williams; Kennedy Lenart Spraggins LLP

(57) ABSTRACT

A polybenzodifuran ladder polymer is disclosed.

20 Claims, 8 Drawing Sheets

PBDF-dicyclopentadienone fully-fused ladder polymer

(56) References Cited

U.S. PATENT DOCUMENTS

| | | | |
|---|---|---|---|
| 9,093,601 | B2 | 7/2015 | Yamazaki et al. |
| 9,299,937 | B2 | 3/2016 | Lee et al. |
| 2013/0175481 | A1 | 7/2013 | Blouin et al. |

FOREIGN PATENT DOCUMENTS

| | | | |
|---|---|---|---|
| CN | 102585175 | B | 12/2013 |
| CN | 103626975 | A | 3/2014 |
| CN | 103665336 | A | 3/2014 |
| CN | 102286142 | B | 9/2014 |
| CN | 104193971 | A | 12/2014 |
| CN | 104311800 | A | 1/2015 |
| CN | 103626975 | B | 12/2015 |
| CN | 105153085 | A | 12/2015 |
| FR | 2989222 | B1 | 11/2014 |
| JP | 2014198682 | A | 10/2014 |
| WO | WO 2008039529 | A1 | 4/2008 |

OTHER PUBLICATIONS

Chen et al., "Synthesis of a Novel Poly(iptycene) Ladder Polymer", Macromolecules, Apr. 2006, 39 (9), pp. 3202-3209, American Chemical Society, acs.org (online), URL: http://pubs.acs.org/doi/abs/10.1021/ma052451f.

Ma et al., "Ladder-Type Dithienonaphthalene-Based Donor—Acceptor Copolymers for Organic Solar Cells", Macromolecules, Jun. 2013, 46 (12), pp. 4813-4821, American Chemical Society, acs.org (online), URL: http://pubs.acs.org/doi/abs/10.1021/ma400696e.

Chen et al., "Synthesis of a New Ladder-Type Benzodi(cyclopentadithiophene) Arene with Forced Planarization Leading to an Enhanced Efficiency of Organic Photovoltaics", Chemistry of Materials, Sep. 2012, 24 (20), pp. 3964-3971, American Chemical Society, acs.org (online), URL: http://pubs.acs.org/doi/abs/10.1021/cm3024082.

International Search Report and Written Opinion of the ISA dated Sep. 1, 2017—International Application No. PCT/IB2017/052761.

AUS920160182US2, Appendix P; List of IBM Patents or Application Treated as Related, Aug. 12, 2016, 2 pages.

Lei et al., *Electron-Deficient Poly(p-pheylene vinylene) Provides Electron Mobility iver 1 $cm^2$ $V^{-1}$ $s^{-1}$ under Ambient Conditions*, Journal of the American Chemical Society (JACS), ACS Publications, Publication Date (Web): May 15, 2013, 4 pages.

* cited by examiner

LADDER POLYBENZODIFURANS

CROSS-REFERENCE TO RELATED APPLICATION

This application is a continuation application of and claims priority from U.S. patent application Ser. No. 15/163,767, filed on May 25, 2016.

BACKGROUND

Field of the Invention

The field of the invention is ladder polymers.

Description of Related Art

Renewable energy and materials is a rapidly growing field, the development of which is in higher demand than ever. One major branch of renewable energy is organic electronics and semiconducting materials. Organic semiconductors made of conjugated small molecules have several advantages over their silicon-based counterparts including renewability, their ability to be solution-processed into lightweight and flexible films, and their ability to have their properties easily tuned through chemical synthesis.

Low band-gap materials based on fused, aromatic organic compounds are important to the development of organic photovoltaics (OPVs) as they can absorb the longer wavelengths of the solar spectrum that smaller aromatic units cannot. Band gaps can be reduced by increasing the planarity of the conjugated backbone by minimizing various steric interactions between aromatic units. Steric interactions tend to cause backbone twisting that result in a pi-electron conjugation that is only effective over shorter, segmented distances. This distance is affected by the structure of different compounds and inherently varies between different materials. As the conjugation length is increased, the band gap will decrease continually. However, conjugated organic materials will reach a point at which additional conjugated units will no longer result in a significant band gap decrease. In this way, increasing conjugation length quickly approaches an asymptotic value for the band gap.

One approach to synthesize highly planar, low band gap materials is by using polymeric systems that are fused through the majority of, if not the entirety of, a conjugated polymer (CP). A CP that is comprised entirely of fused rings is called a ladder polymer. Due to the reasons mentioned above, ladder polymers have very low band gaps. Further, an additional benefit of an extended fused ring system is better charge transport due to pi-stacking between adjacent polymer chains. One challenge associated with ladder polymers is poor solubility in organic solvents to remain solution-processable.

SUMMARY

According to an embodiment, a polybenzodifuran (PBDF) ladder polymer is disclosed.

According to another embodiment, an organic photovoltaic (OPV) device is disclosed. The OPV device includes an active layer that includes a polybenzodifuran ladder polymer.

According to another embodiment, a process of forming a polybenzodifuran ladder polymer is disclosed. The process includes forming a polybenzodifuran material that includes two aryl-iodide functional handles per repeat unit. The process further includes forming a polybenzodifuran ladder polymer from the polybenzodifuran material.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

DETAILED DESCRIPTION

The present disclosure describes polybenzodifurans (PBDFs), methods of forming PBDFs, ladder PBDFs, and methods of forming ladder PBDFs. In a particular embodiment, the ladder PBDFs may be used as a component of an active layer of an organic photovoltaic (OPV) device.

Previous attempts at synthesizing ladder polymers include polyiptycenes, but these materials are not suitable for organic photovoltaics because the materials are too emissive (fluorescent). Other attempts only use shortened ladder segments but do not fuse the entire polymer. The synthetic pathways described herein provide a route to a soluble, extended ladder polymer using aromatic heterocycles that are highly suitable for high-efficiency, organic photovoltaic applications.

In the present disclosure, starting from commercially available starting materials, bisalkynyl-tetralkoxybenzenes (BATBs) are synthesized, and the BATBs are then polymerized via Glaser-Hay coupling polymerization. The resultant polymers are subjected to iodine-promoted cyclization conditions to yield polybenzodifurans (PBDFs). The PBDFs have two aryl-iodide functional handles per repeat unit, which are used to form the ladder polymers. The iodines are then reacted via either palladium-catalyzed carbonylation, Hartwig-Buchwald coupling, or Zinc/Copper coupling with oxalyl chloride to give fused ladder PBDF-dicyclopentadienones, PBDF-pyrroles, and PBDF-dione polymers, respectively (among other possible catalytic/non-catalytic methods). The ladder PBDF-diones can be reacted further with dialkyl-diaminobenzenes to give ladder PBDF-quinoxalines. These polymers may be used as a component in an active layer of an OPV device. For example, the polymers may be blended with n-type materials (e.g., fullerenes) or p-type materials (e.g., very electron rich conjugated polymers or small molecules), and the blend may be used as the active layer in the OPV device.

Figure 1:
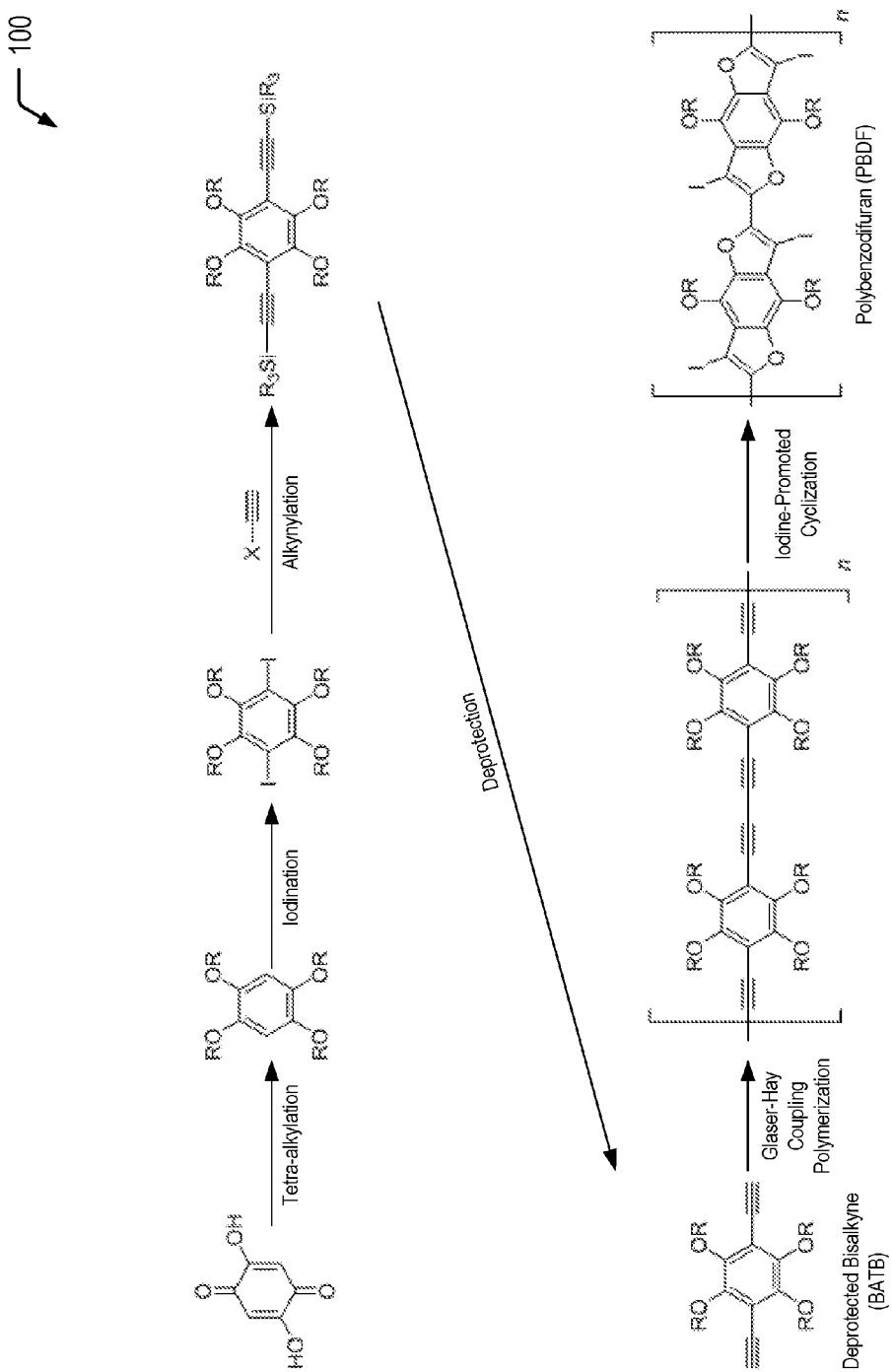
FIG. 1 is a chemical reaction diagram illustrating a process of forming a polybenzodifuran (PBDF) material, according to one embodiment.

Referring to FIG. 1, a chemical reaction diagram 100 illustrates an example of a process of forming a PBDF, according to an embodiment. In FIG. 1, a dihydroxybenzene starting material is tetra-alkylated with the same alkyl chain via substitution chemistry. As illustrated and further described herein with respect to FIG. 2, in other cases, the dihydroxybenzene starting material may be tetra-alkylated with two different alkyl chains via two sequential substitution reactions. In either case, the tetra-alkoxybenzenes are used to form BATBs, which are then polymerized via Glaser-Hay coupling polymerization and subjected to iodine-promoted cyclization conditions to yield PBDFs. As illustrated and further described herein with respect to FIGS. 3-6, the PBDFs may be used to form various ladder PBDFs (e.g., for use as a component of an active layer of an OPV device).

The first chemical reaction illustrates that a dihydroxybenzene material is tetra-alkylated with the same alkyl chain (designated as R in FIG. 1) via substitution chemistry to yield tetra-alkoxybenzenes. As illustrated and further described herein with respect to FIG. 2, in alternative cases, the monomer may be tetra-alkylated with two different alkyl chains (designated as R and Me in FIG. 2) via two sequential substitution reactions. R may be branched or linear alkyl chains (e.g., C1-C20). In the case of branched alkyl chains, a typical branching point may be at either C1 or C2, while other examples such as 3,7-dimethyloctyle chains have alternate branching points.

As an example of tetra-alkylation, the 1,2,4,5-tetrahydroxybenzene (which may be generated in situ by the hydrogenation of 2,5-dihydroxy-1,4-benzoquinone, which may be accomplished using a catalyst which may be $PtO_2$ (0.5 mol %) at atmospheric pressure) may be reacted with an alkyl bromide (RBr) in the presence of dimethylformamide (DMF) and an inorganic base which may be cesium carbonate. Alternatively, if R is 2-ethylhexyl, then the dihydroxybenzene material may be reacted with KOH/NaI/EtOH.

The second and third chemical reactions illustrate that the tetra-alkoxybenzenes are iodinated (e.g., with iodine monochloride) and alkynylated with alkysilyl-protected alkynes (e.g., via Sonogashari cross-coupling chemistry).

As an example of iodination, the tetra-alkoxybenzenes may be added to a solution of iodine monochloride in a polar protic solvent which may include methanol (MeOH), ethanol (EtOH), isopropanol (iPrOH), etc. which may be cooled to 15° C. The mixture may then be heated under reflux until iodination is complete. The reaction may then be cooled to 0° C. and the resulting precipitate may be filtered and rinsed with cold methanol. The filtrate may then be dried or purified further by techniques known to those skilled in the art. Alternatively, iodination may be performed by using the subsequent addition of butyl lithium solution, and iodine, followed by quenching with an aqueous 10% potassium hydroxide solution.

Example alkynylation reaction conditions include adding catalysts which may be $Pd(PPh_3)_2Cl_2$ and CuI, to a deoxygenated solution of the product from previous step in an organic solvent which may be $Et_3N$ or a mixture of $Et_3N$ and an organic solvent that may include DMF, DCM, THF, etc. at 25° C. Upon completion, the solvent may be removed in vacuo, and the resulting slurry may be purified further by either standard aqueous workup conditions or filtration conditions. The crude product may be purified by recrystallization, column chromatography or by other techniques.

The fourth chemical reaction illustrates the deprotection of the alkynes under mild basic conditions to form a deprotected bisalkyne, also referred to as a bisalkynyl-tetraoxybenzene (BATB). To a stirred solution of the previous product (1 equiv.) in a solvent or solvent mixture which may be 1:1 DCM/MeOH is added a mild base which may be $K_2CO_3$ (1.1 equiv.). The reaction mixture is stirred until completion and most of the solvent may be removed in vacuo. The resulting slurry may be added to water and may be extracted with DCM (3 times). The combined organic layers may be combined and may be washed with brine and dried over magnesium sulfate (MgSO4). This may be filtered and the solvents may be removed in vacuo. The crude product may be purified via column chromatography or by other techniques.

The fifth chemical reaction illustrates that the BATBs are polymerized (e.g., via Glaser-Hay coupling chemistry, which is a homocoupling reaction of alkynes). An example of Glazer-Hay coupling chemistry may include the use of CuCl, tetramethylethylenediamine (TMEDA) in a solution of tetrahydrofuran (THF). The previous product may be dissolved in TMEDA or a mixture of an organic solvent such as DMF, DCM, $CHCl_3$, toluene, chlorobenzene, or THF and TMEDA. This reaction mixture may be sparged with oxygen. To this solution may be added a copper compound which may be copper (I) chloride and copper (I) acetate (1 mol %-100 mol %) The reaction mixture may be heated to a temperature up to and including reflux and stirred until desired polymer length is achieved (1-72 hours likely). The reaction mixture may be poured into methanol and the resulting precipitated polymer may be filtered. The crude polymer may be purified by any combination of re-precipitation, Soxhlet extraction, or column chromatography.

The sixth chemical reaction illustrates that the resultant polymers are subjected to iodine-promoted cyclization conditions to yield polybenzodifurans (PBDFs). An example of iodine-promoted cyclization conditions includes the use of $I_2$ and $CHCl_3$. To a stirred solution of the poly(phenylene dibutene) in an organic solvent which may include chloroform, chlorobenzene, or ortho-dichlorobenzene which may be at room temperature or cooled to 0° C., is added a solution of iodine in the same organic solvent, dropwise. The reaction may be stirred at the cool temperature, room temperature, or an elevated temperature until iodine-cyclization reaction is complete. The reaction mixture may be poured into methanol and the resulting precipitated polymer may be filtered. The crude polymer may be purified by any combination of re-precipitation, Soxhlet extraction, or column chromatography.

This chemical reaction has the unique advantage of simultaneously forming the benzodifuran aromatic heterocycle while yielding two aryl-iodide functional handles per repeat unit as a post-polymerization reaction. As illustrated and further described herein with respect to the examples of FIGS. 3-6, the aryl-iodide functional handles may be used to form a variety of ladder polymers (e.g., for use as a component in an active layer of an OPV device). For example, the iodines may be reacted via either palladium-catalyzed carbonylation, Hartwig-Buchwald coupling, or Zinc/Copper coupling with oxalyl chloride to yield fused ladder PBDF-cyclopentadiones, PBDF-pyrroles, and PBDF-dione polymers. In some cases, the ladder PBDF-dione can be reacted further with dialkyl-diamobenzenes to yield ladder PBDF-quinoxaline.

Figure 2:
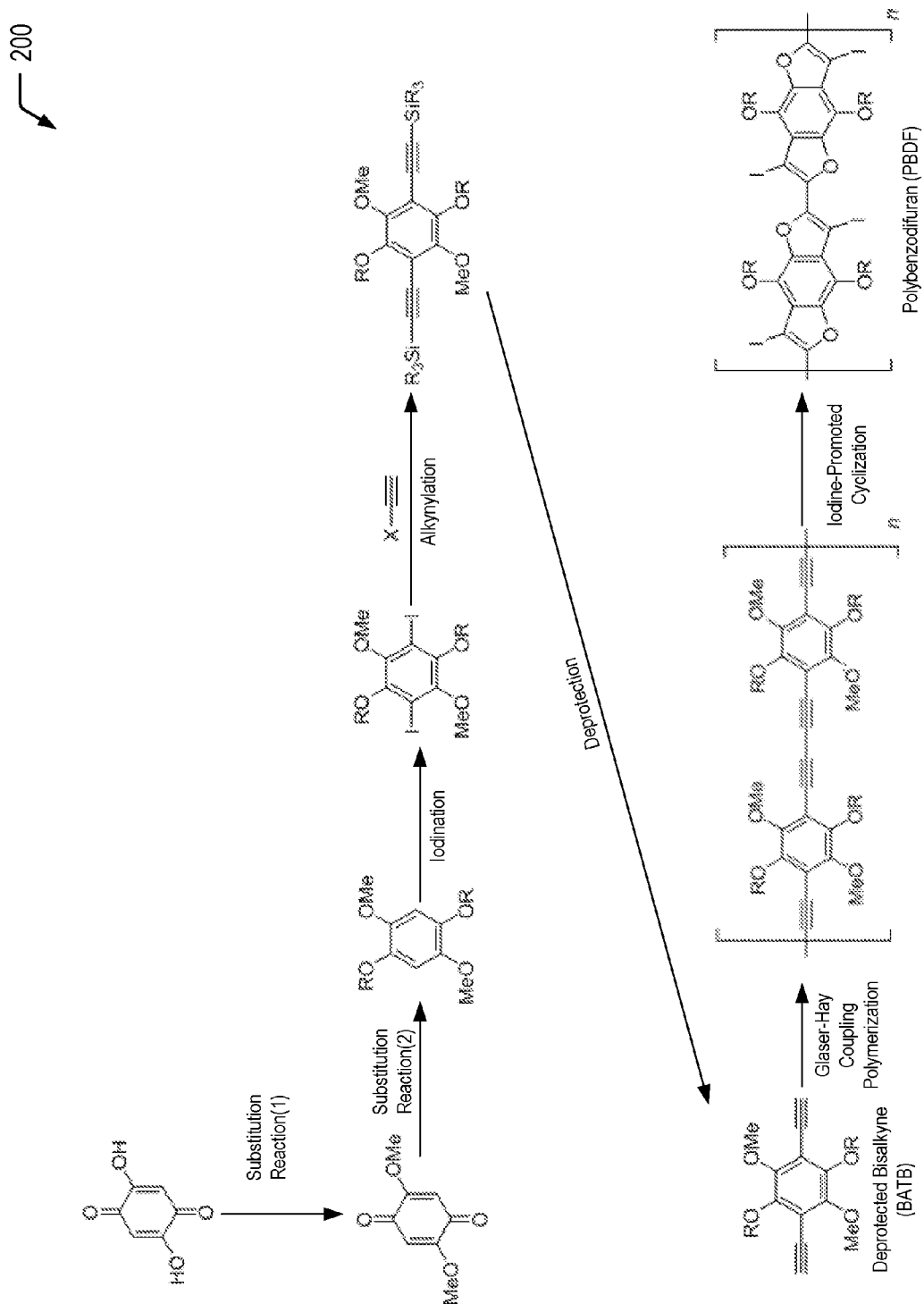
FIG. 2 is a chemical reaction diagram illustrating a process of forming a PBDF material, according to one embodiment.

Thus, FIG. 1 illustrates an example of a process of forming a PBDF polymer. In FIG. 1, the monomers are tetra-alkylated with the same alkyl chain via substitution chemistry (as shown in the first chemical reaction). FIG. 2 illustrates an alternative example in which the monomers are tetra-alkylated with two different alkyl chains via two sequential substitution reactions. As described further herein with respect to FIGS. 3-6, the PBDF polymer depicted in FIG. 1 may be used to form a variety of PBDF ladder polymers (e.g., for use as a component of an active layer of an OPV device).

Referring to FIG. 2, a chemical reaction diagram 200 illustrates an example of a process of forming a PBDF. In contrast to FIG. 1, in which the monomers are tetra-alkylated with the same alkyl chain via substitution chemistry (as shown in the first chemical reaction), FIG. 2 illustrates that the monomers may be tetra-alkylated with two different alkyl chains via two sequential substitution reactions.

The first chemical reaction (identified as "Substitution Reaction(1)" in FIG. 2) illustrates that a dihydroxybenzene material is alkylated using substitution chemistry to add two methoxy groups, and the second chemical reaction (identified as "Substitution Reaction(2)" in FIG. 2) illustrates the addition of two other alkyl groups (designed by the letter R). As an example, 2,5-dimethoxy-1,4-benzoquinone may be suspended in ethanol and cooled to 0° C., sodium borohydride (2.5 equiv.) may be added portionwise, and the reaction may be stirred for 3 hours. The reaction mixture may be quenched with dilute acid, the organic layers separated, extracted, and solvents may be removed in vacuo. The crude product may be dissolved in DMF. Potassium carbonate and an alkyl halide may be added to the reaction mixture, which then may be heated to 60° C. The reaction may be stirred for 12 hours, may be poured into water, and may be extracted with diethyl ether (3 times). The combined organic layers may be combined and may be washed with water, brine, and dried over magnesium sulfate ($MgSO_4$). This may be filtered and the solvents may be removed in vacuo. The crude product may be purified via column chromatography or by other techniques. The first substitution reaction may also include the use of $BF_3.Et_2O$ in a solution of methanol (MeOH) at a temperature of about 70° C. As an example, the second substitution reaction may include the use of $Na_2$ ($S_2O_4$) and RCl in a $H_2O$/MeOH/THF solution.

The subsequent chemical reactions depicted in FIG. 2 may include similar reaction conditions to those described herein with respect to FIG. 1. The methoxy groups may eliminate faster in the iodine mechanism than a second degree alkyl chain, as part of the nucleophilic substitution mechanism. As the methyl groups are set up on opposite sides of the molecule, the oxygens that are bonded to those methyl groups may be more likely to form the benzodifuran in the specific conformation where the oxygens (in the furan portion) are facing in opposite directions. This is desirable because if the oxygens are on the same side, there may be decreased extended conjugation properties.

Thus, FIG. 2 illustrates an example of a process of forming a PBDF polymer. In contrast to FIG. 1, FIG. 2 illustrates an alternative example in which the monomers are tetra-alkylated with two different alkyl chains via two sequential substitution reactions. As described further herein with respect to FIGS. 3-6, the PBDF polymer depicted in FIG. 2 may be used to form a variety of PBDF ladder polymers (e.g., for use as a component of an active layer of an OPV device).

Figure 3:
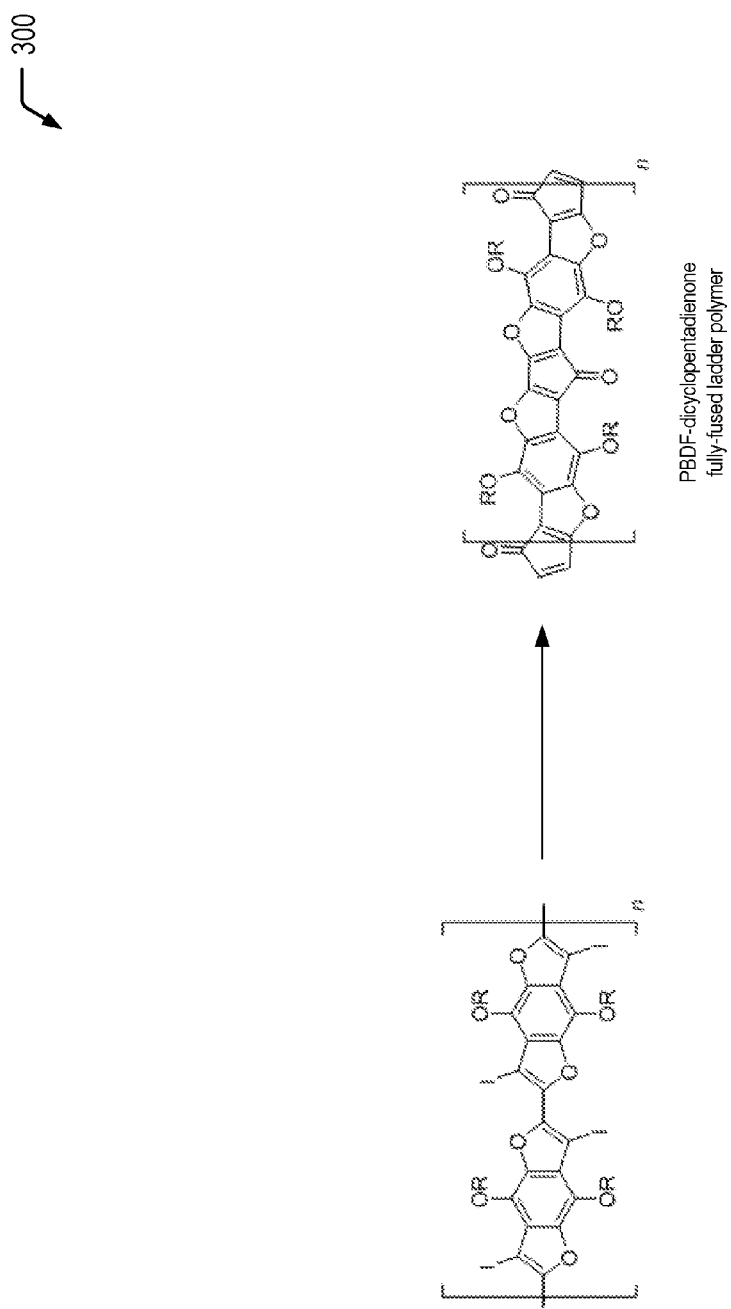
FIG. 3 is a chemical reaction diagram illustrating a process of forming a ladder PBDF, according to one embodiment.
Figure 4:
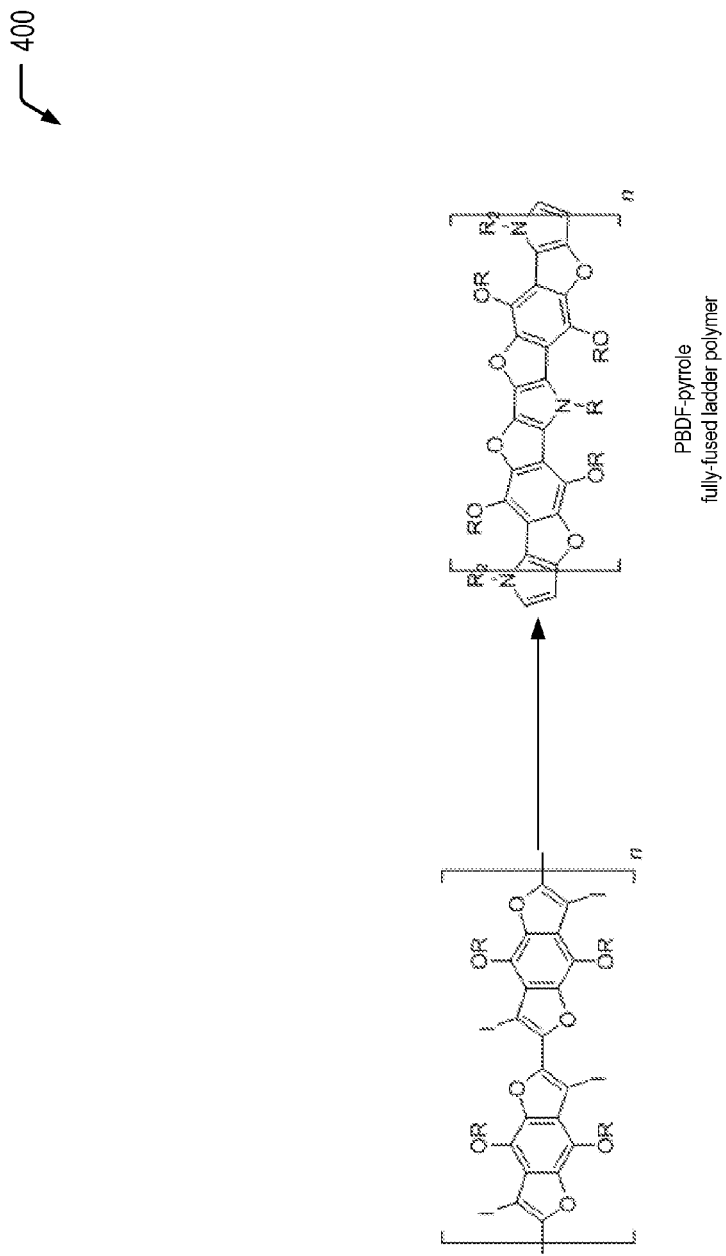
FIG. 4 is a chemical reaction diagram illustrating a process of forming a ladder PBDF, according to one embodiment.
Figure 5:
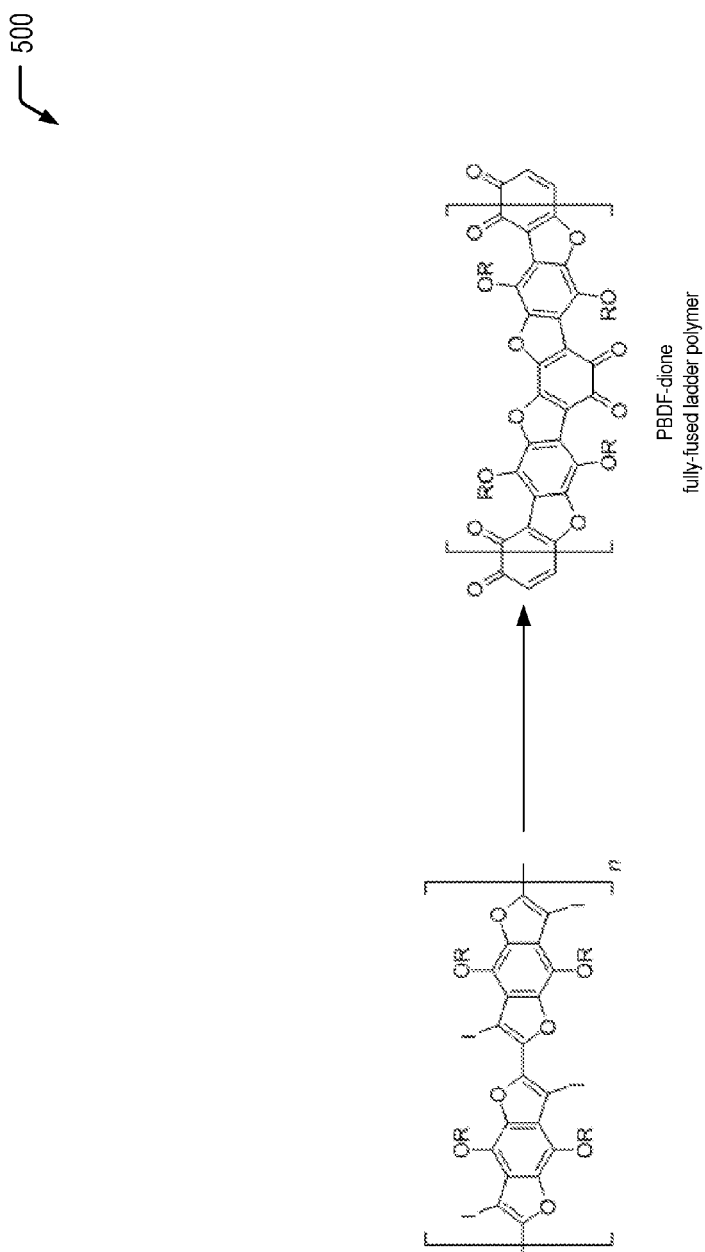
FIG. 5 is a chemical reaction diagram illustrating a process of forming a ladder PBDF, according to one embodiment.

FIGS. 3-5 illustrate examples of ladder polymers that may be formed from the PBDFs of the present disclosure. The ladder polymers may have different energy levels, band gaps, solubility, crystal-packing (among other material properties). As a result, the ladder polymers may be used in a variety of OPV systems. The ladder polymers may be blended with n-type materials (e.g., fullerenes) or p-type materials (e.g., electron-rich conjugated polymers or small molecules) to form the active layer in OPV devices.

Referring to FIG. 3, a chemical reaction diagram 300 illustrates an example of a process of forming a fully-fused ladder polymer from the PBDFs of the present disclosure. In FIG. 3, the PBDF formed according to the process described herein with respect to FIGS. 1 and 2 may be used to form a PBDF-dicyclopentadienone fully-fused ladder polymer.

As an example, the reaction of PBDF under palladium-catalyzed carbonylation conditions yields PBDF-dicyclopentadienone, which is a ladder polymer with alternating electron-rich and electron-poor units, essentially making a donor-acceptor completely fused ladder polymer. To a stirred, deoxygenated solution of the BDF-polymer in a suitable organic solvent or mixtures of solvents such as $CHCl_3$, chlorobenzene, toluene, DMF, etc. may be added catalyst such as $Pd(OAc)_2$, a ligand such as $P(o-Tol)_3$, and a base such as potassium carbonate. The reaction mixture may also include deoxygenated water that may contain a phase transfer agent/base such as tetrabutylammonium hydroxide. To the reaction mixture may be added an atmosphere, or constant stream of carbon monoxide. The reaction mixture may be heated to a temperature that may including refluxing or in excess of 100° C. The reaction may require an additional reaction step where the polymer from the first step may be reacted with either lithium metal, or a lithium magnesium complex to complete the carbonylation. Upon completion of the reaction, the reaction mixture may be poured into methanol and the resulting precipitated polymer may be filtered. The crude polymer may be purified by any combination of re-precipitation, Soxhlet extraction, or column chromatography.

The PBDF-dicyclopentadienone ladder polymer of FIG. 3 may be blended with n-type materials (e.g., fullerenes) or p-type materials (e.g., electron-rich conjugated polymers or small molecules) to form the active layer in OPV devices. As an example, a p-type to n-type blend ratio may be in a range of 1 (p-type) to 10 (n-type), such as in a range of 1 to 8, in a range of 1 to 6, in a range of 1 to 4, in a range of 1 to 2, or in a range of 1 to 1. In some cases, the OPV device may include multiple active layers (e.g., 1, 2, or 3 layers). The active layer with the PDBF ladder polymer may have a narrow band gap that absorbs a narrow spectrum, while one or more other active layers may be used to absorb different parts of the spectrum.

Referring to FIG. 4, a chemical reaction diagram 400 illustrates an example of a process of forming a fully-fused ladder polymer from the PBDFs of the present disclosure. In FIG. 4, the PBDF formed according to the process described herein with respect to FIGS. 1 and 2 may be used to form a PBDF-pyrrole fully-fused ladder polymer.

As an example, the reaction of PBDF with alkylamines under Hartwig-Buchwald cross-coupling conditions yields a PBDF-pyrrole, which is an entirely electron-rich polymer, which may serve as a p-type component of an active layer of an OPV device. To a stirred, deoxygenated solution of the BDF-polymer in a suitable organic solvent or mixtures of solvents such as $CHCl_3$, chlorobenzene, toluene, DMF, etc. may be added an excess of alkylamine and catalytic $Pd(OAc)_2$, a ligand such as $P(o-Tol)_3$, and a base such as sodium tert-butoxide. The reaction mixture may be heated to a temperature that may include refluxing or in excess of 100°

C. Upon completion of the reaction, the reaction mixture may be poured into methanol and the resulting precipitated polymer may be filtered. The crude polymer may be purified by any combination of re-precipitation, Soxhlet extraction, or column chromatography.

The PBDF-pyrrole ladder polymer of FIG. 4 may be blended with n-type materials (e.g., fullerenes) or p-type materials (e.g., electron-rich conjugated polymers or small molecules) to form the active layer in OPV devices. As an example, a p-type to n-type blend ratio may be in a range of 1 (p-type) to 10 (n-type), such as in a range of 1 to 8, in a range of 1 to 6, in a range of 1 to 4, in a range of 1 to 2, or in a range of 1 to 1. In some cases, the OPV device may include multiple active layers (e.g., 1, 2, or 3 layers). The active layer with the PDBF ladder polymer may have a narrow band gap that absorbs a narrow spectrum, while one or more other active layers may be used to absorb different parts of the spectrum.

Referring to FIG. 5, a chemical reaction diagram 500 illustrates an example of a process of forming a fully-fused ladder polymer from the PBDFs of the present disclosure. In FIG. 5, the PBDF formed according to the process described herein with respect to FIGS. 1 and 2 may be used to form a PBDF-dione fully-fused ladder polymer.

As an example, PBDF, propiolic acid (>1.0 equiv per repeat unit, Pd(PPh3)2Cl2 (2.5 mol %), 1,4-bis-(diphenylphosphino)butane (5 mol %), DBU (10 mol %), in a deoxygenated solution of a solvent that may include $CHCl_3$, chlorobenzene, toluene, DMF, DMSO, etc. The reaction mixture may be allowed to stir at 110° C. for 3 h. A solution that may include hydroiodic acid in a solvent that may be DMSO, CuI (5 mol %), and Cu(OTf)2 (5 mol %) may be added to the reaction mixture, which may then be heated to 140° C. for 6 h. Upon completion of the reaction, the reaction mixture may be poured into methanol and the resulting precipitated polymer may be filtered. The crude polymer may be purified by any combination of re-precipitation, Soxhlet extraction, or column chromatography. Other conditions to perform this transformation may include reacting PBDF with oxalyl chloride under Zn/Cu coupling conditions using a nickel catalyst to yield a PBDF-dione ladder polymer. As illustrated and further described herein with respect to FIG. 6, in some cases, the PBDF-dione ladder polymer of FIG. 5 may be reacted further with diamino-dialkylbenzenes to yield a PBDF-quinoxaline ladder polymer. The PBDF-dione ladder polymer of FIG. 5 contains alternating electron-rich and electron-poor units, essentially making a donor-acceptor completely fused ladder polymer (as in the example ladder polymer of FIG. 3).

The PBDF-dione ladder polymer of FIG. 5 may be blended with n-type materials (e.g., fullerenes) or p-type materials (e.g., electron-rich conjugated polymers or small molecules) to form the active layer in OPV devices. As an example, a p-type to n-type blend ratio may be in a range of 1 (p-type) to 10 (n-type), such as in a range of 1 to 8, in a range of 1 to 6, in a range of 1 to 4, in a range of 1 to 2, or in a range of 1 to 1. In some cases, the OPV device may include multiple active layers (e.g., 1, 2, or 3 layers). The active layer with the PDBF ladder polymer may have a narrow band gap that absorbs a narrow spectrum, while one or more other active layers may be used to absorb different parts of the spectrum.

Figure 6:
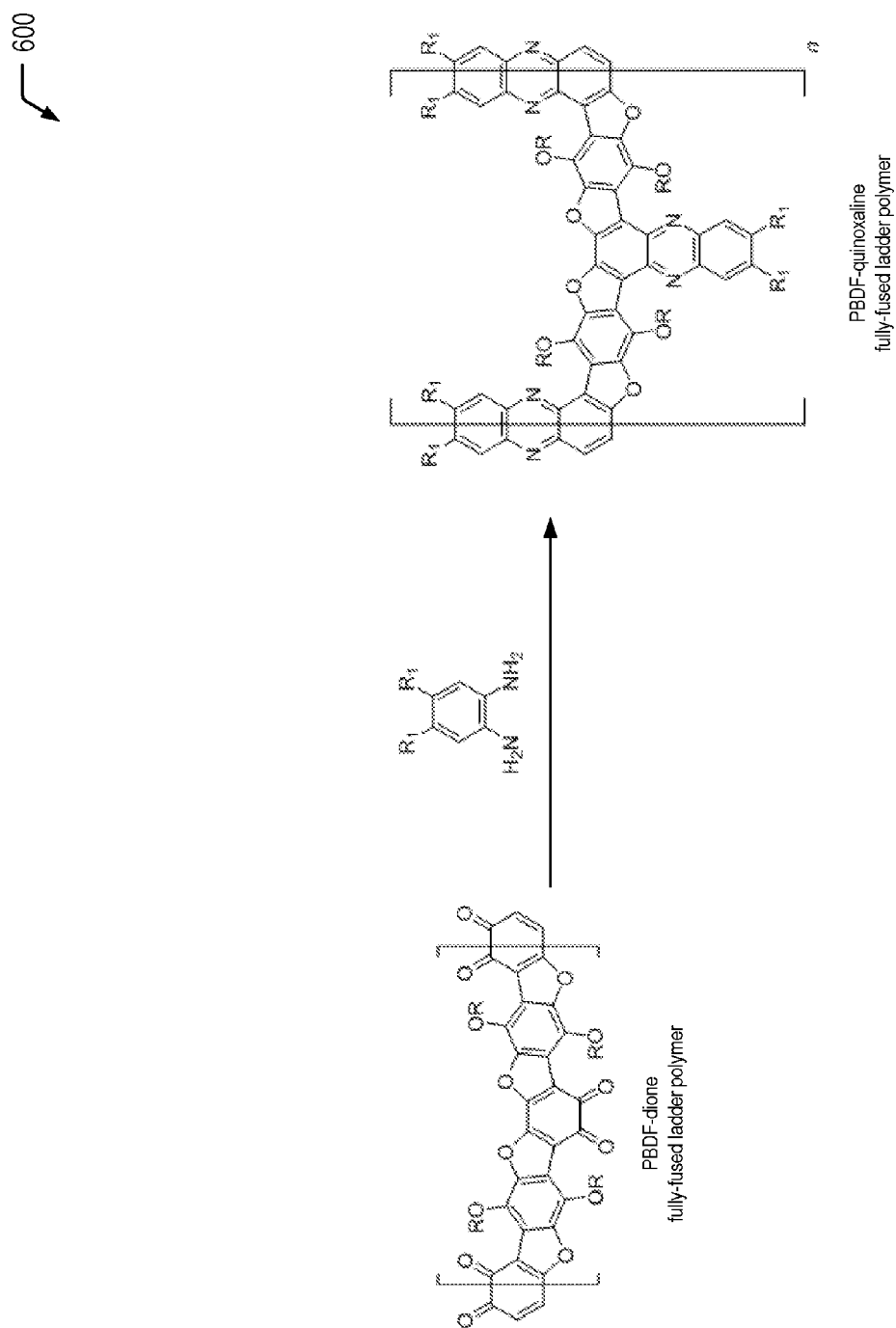
FIG. 6 is a chemical reaction diagram illustrating a process of forming a ladder PBDF, according to one embodiment.

Referring to FIG. 6, a chemical reaction diagram 600 illustrates an example of a process of forming a fully-fused ladder polymer from the PBDFs of the present disclosure. In FIG. 6, the PBDF-dione fully-fused ladder polymer of FIG. 5 may be used to form a PBDF-quinoxaline fully-fused ladder polymer.

FIG. 6 illustrates that the PBDF-dione ladder polymer of FIG. 5 may be reacted further with diamino-dialkylbenzenes to yield a PBDF-quinoxaline ladder polymer. The PBDF-quinoxaline ladder polymer contains alternating electron-rich and electron-poor units, essentially making a donor-acceptor completely fused ladder polymer (as in the example ladder polymers of FIGS. 3 and 5). To a stirred, deoxygenated solution of the PBDF-polymer in a suitable organic solvent or mixtures of solvents such as $CHCl_3$, chlorobenzene, toluene, DMF, etc. may be added an excess of 1,2-bisalkyl-4,5-diaminobenzene and catalytic $Pd(OAc)_2$, a ligand such as $P(o-Tol)_3$, and a base such as sodium tert-butoxide. The reaction mixture may be heated to a temperature that may include refluxing or in excess of 100° C. Upon completion of the reaction, the reaction mixture may be poured into methanol and the resulting precipitated polymer may be filtered. The crude polymer may be purified by any combination of re-precipitation, Soxhlet extraction, or column chromatography.

The PBDF-quinoxaline ladder polymer of FIG. 6 may be blended with n-type materials (e.g., fullerenes) or p-type materials (e.g., electron-rich conjugated polymers or small molecules) to form the active layer in OPV devices. As an example, a p-type to n-type blend ratio may be in a range of 1 (p-type) to 10 (n-type), such as in a range of 1 to 8, in a range of 1 to 6, in a range of 1 to 4, in a range of 1 to 2, or in a range of 1 to 1. In some cases, the OPV device may include multiple active layers (e.g., 1, 2, or 3 layers). The active layer with the PDBF ladder polymer may have a narrow band gap that absorbs a narrow spectrum, while one or more other active layers may be used to absorb different parts of the spectrum.

Figure 7:
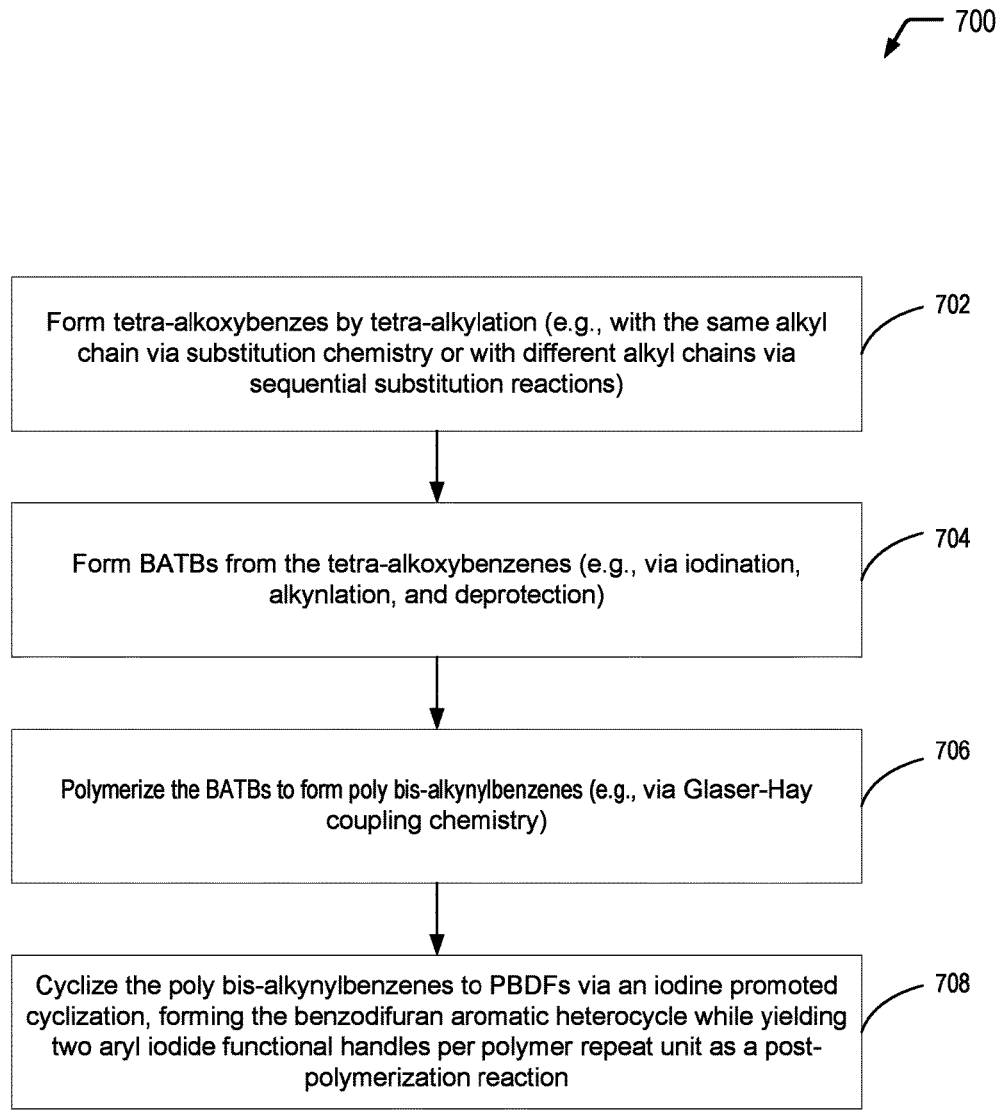
FIG. 7 is a flow diagram showing a particular embodiment of a process of forming PBDF material that includes two aryl-iodide functional handles per repeat unit.

Referring to FIG. 7, a flow diagram illustrates an exemplary process 700 of forming a PBDF that includes two aryl iodide functional handles per polymer repeat, according to a particular embodiment. As described further herein, the two aryl iodide functional handles may be used to form a variety of ladder polymers (e.g., for use as a component of an active layer of an OPV device).

In the particular embodiment illustrated in FIG. 7, operations associated with an example process of forming deprotected bisalkynes (also referred to herein as BATBs) are identified as operations 702-704, while operations associated with the formation of PBDFs are identified as operations 706-708. It will be appreciated that the operations shown in FIG. 7 are for illustrative purposes only and that the chemical reactions may be performed in alternative orders, at alternative times, by a single entity or by multiple entities, or a combination thereof. As an example, one entity may produce tetra-alkoxybenzenes, another entity may utilize the tetra-alkoxybenzenes to form deprotected bisalkynes, while another entity may form polybis-alkynylbenzenes from the deprotected bisalkynes (e.g., via Glaser-Hay coupling chemistry). Further, alternative or additional entities may perform operations associated with forming PBDFs (e.g., via iodine-promoted cyclization).

The process 700 includes forming tetra-alkoxybenzenes by tetra-alkylation, at 702. For example, referring to FIG. 1, the first chemical reaction illustrates that the dihydroxybenzene material may be tetra-alkylated with the same alkyl chain (designated R in FIG. 1) via substitution chemistry. As another example, FIG. 2 illustrates that the dihydroxybenzene material may be tetra-alkylated with two different alkyl chains (designated as R and Me in FIG. 2) via two sequential substitution reactions.

The process 700 includes forming BATBs from the tetra-alkoxybenzenes, at 704. For example, referring to FIG. 1, the tetra-alkoxybenzene material with the same alkyl chains may be iodinated, alkynylated, and deprotected to form the BATB having the same alkyl chains. As another example, referring to FIG. 2, the tetra-alkoxybenzene material with the two different alkyl chains may be iodinated, alkynylated, and deprotected to form the BATB having the two different alkyl chains.

The process 700 includes polymerizing the BATBs to form polybis-alkynylbenzenes, at 706. For example, referring to FIG. 1, Glaser-Hay coupling chemistry may be used to form the polybis-alkynylbenzene material from the deprotected bisalkyne material (having the same alkyl chains). As another example, referring to FIG. 2, Glaser-Hay coupling chemistry may be used to form the polybis-alkynylbenzene material from the deprotected bisalkyne material (having the two different alkyl chains).

The process 700 includes forming PBDFs from the polybis-alkynylbenzenes via iodocylization, at 708. An iodine promoted cyclization results in the formation of the benzenodifuran aromatic heterocycle while yielding two aryl iodide functional handles per polymer repeat unit as a post-polymerization reaction (as shown in the examples of FIGS. 1 and 2).

Thus, FIG. 7 illustrates an example of a process of forming PBDFs that include two aryl iodide functional handles per polymer repeat unit. As described further herein with respect to FIG. 8, the two aryl iodide functional handles of the PBDFs may be used to form a variety of ladder polymers. In some cases, the ladder polymers may be used as a component of an active layer of an OPV device.

Figure 8:
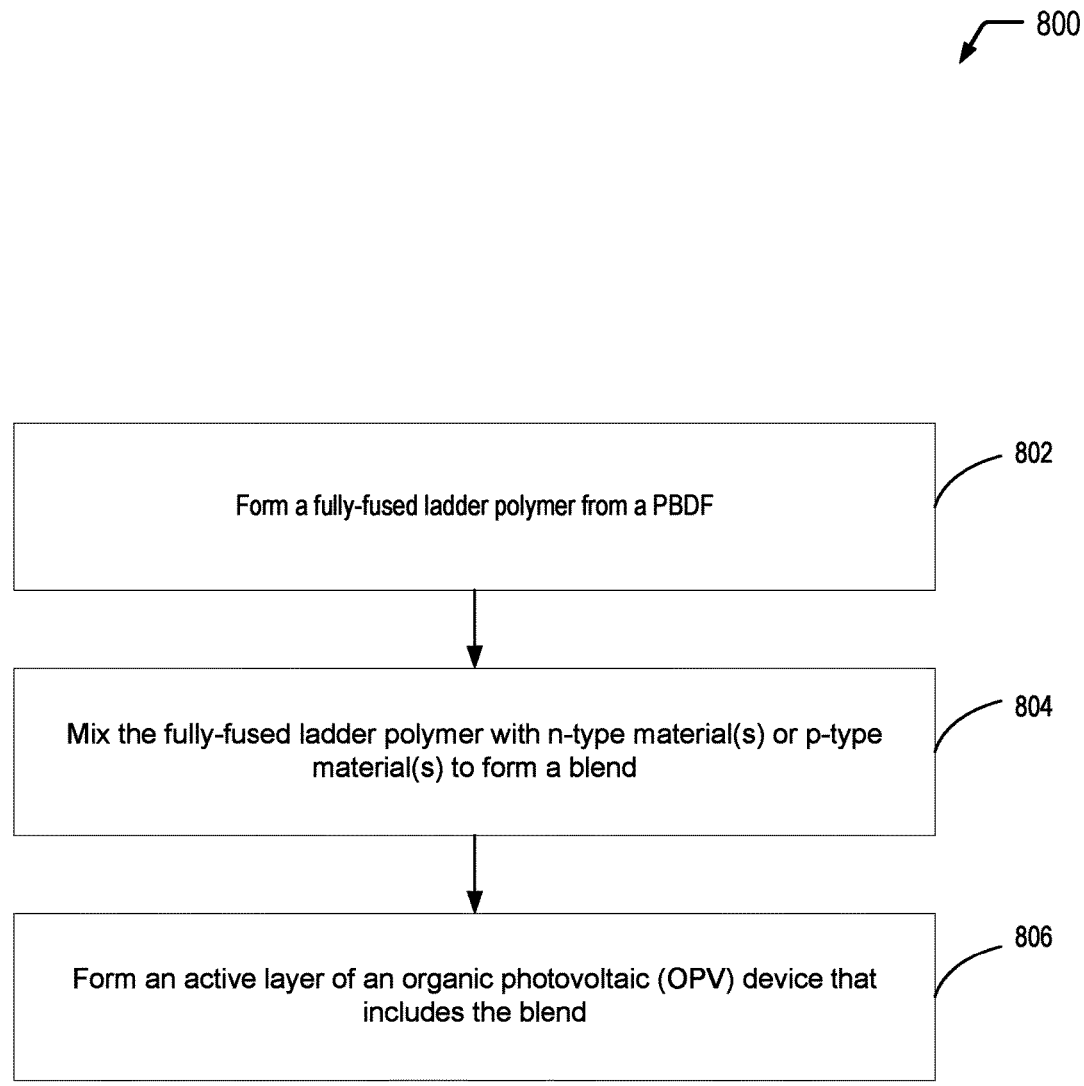
FIG. 8 is a flow diagram showing a particular embodiment of a process of forming an active layer of an organic photovoltaic (OPV) device that includes a ladder PBDF.

Referring to FIG. 8, a flow diagram illustrates an exemplary process 800 of forming a fully-fused ladder polymer from the PBDFs of the present disclosure, according to a particular embodiment. In the particular embodiment illustrated in FIG. 8, the process 800 further includes mixing the fully-fused ladder polymer with n-type material(s) or p-type material(s) to form a blend, which may be used to form an active layer of an OPV device.

In the particular embodiment illustrated in FIG. 8, operations associated with an example process of forming a fully-fused ladder polymer are identified as operation 802, while operations associated with forming an active layer of an OPV device that includes the fully-fused ladder polymer are identified as operations 804-806. It will be appreciated that the operations shown in FIG. 8 are for illustrative purposes only and that the operations may be performed in alternative orders, at alternative times, by a single entity or by multiple entities, or a combination thereof. As an example, one entity may form the fully-fused ladder polymer from a PBDF material, another entity may mix the PBDF material with n-type material(s) or p-type material(s), while another entity may utilize the blend to form an active layer of an OPV device.

The process 800 includes forming a fully-fused ladder polymer from a PBDF, at 802. For example, referring to FIG. 3, the PBDF may be used to form a PBDF-dicyclopentadienone fully-fused ladder polymer. As another example, referring to FIG. 4, the PBDF may be used to form a PBDF-pyrrole fully-fused ladder polymer. As a further example, referring to FIG. 5, the PBDF may be used to form a PBDF-dione fully-fused ladder polymer. As yet another example, referring to FIG. 6, the PBDF-dione polymer of FIG. 5 may be used to form a PBDF-quinoxaline fully-fused ladder polymer.

The process 800 includes mixing the fully-fused ladder polymer with n-type material(s) or p-type material(s) to form a blend, at 804. For example, the fully-fused ladder polymer may be blended with an n-type material (e.g., a fullerene, such as PCBM) or a p-type material (e.g., very electron rich conjugated polymers or small molecules). A blend ratio may vary depending on the particular materials (among other factors). As an example, a p-type to n-type blend ratio may be in a range of 1 (p-type) to 10 (n-type), such as in a range of 1 to 8, in a range of 1 to 6, in a range of 1 to 4, in a range of 1 to 2, or in a range of 1 to 1.

The process 800 includes forming an active layer of an OPV device that includes the blend, at 806. For example, the PBDF ladder polymer and the n-type/p-type material(s) may be solution processed to form the active layer of the OPV device.

Thus, FIG. 8 illustrates an example of a process of utilizing the PBDFs of the present disclosure to form fully-fused ladder polymers. The fully-fused ladder polymers (or a blend that includes n-type or p-type materials) may be used to form an active layer of an OPV device (among other possible uses).

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. A process of forming a polybenzodifuran ladder polymer, the process comprising:
   forming a polybenzodifuran material that includes two aryl-iodide functional handles per repeat unit; and
   forming a polybenzodifuran ladder polymer from the polybenzodifuran material.

2. The process of claim 1, further comprising forming the polybenzodifuran material via iodine-promoted cyclization.

3. The process of claim 1, wherein the polybenzodifuran ladder polymer includes a benzodifuran-dicyclopentadienone repeat unit.

4. The process of claim 1, wherein the polybenzodifuran ladder polymer includes a benzodifuran-pyrrole repeat unit.

5. The process of claim 1, wherein the polybenzodifuran ladder polymer includes a benzodifuran-dione repeat unit.

6. The process of claim 1, wherein the polybenzodifuran ladder polymer includes a benzodifuran-quinoxaline repeat unit.

7. The process of claim 1, wherein the polybenzodifuran material is formed from a deprotected bisalkyne via Glaser-Hay coupling polymerization followed by iodine-promoted cyclization.

8. The process of claim 7, further comprising forming the deprotected bisalkyne via tetra-alkylation of a dihydroxybenzene material.

9. The process of claim 8, wherein the dihydroxybenzene material includes 2,5-dihydroxy-1,4-benzoquinone.

10. The process of claim 7, further comprising forming the deprotected bisalkyne via tetra-alkylation of a dimethoxybenzene material.

11. The process of claim 10, wherein the dimethoxybenzene material includes 2,5-dimethoxy-1,4-benzoquinone.

12. The process of claim 1, wherein the repeat unit of the polybenzodifuran material has the following chemical structure:

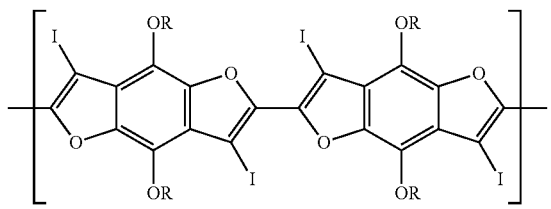

wherein R represents an alkyl group.

13. A process comprising forming a polybenzodifuran ladder polymer from a polybenzodifuran material that includes two aryl-iodide functional handles per repeat unit.

14. The process of claim 13, wherein the repeat unit of the polybenzodifuran material has the following chemical structure:

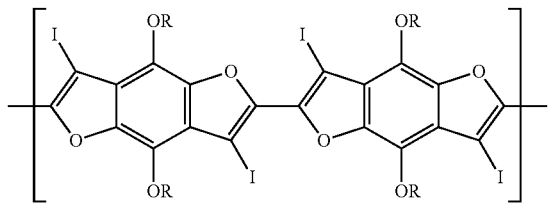

wherein R represents an alkyl group.

15. The process of claim 13, wherein the polybenzodifuran ladder polymer includes a benzodifuran-dicyclopentadienone repeat unit.

16. The process of claim 13, wherein the polybenzodifuran ladder polymer includes a benzodifuran-pyrrole repeat unit.

17. The process of claim 13, wherein the polybenzodifuran ladder polymer includes a benzodifuran-dione repeat unit.

18. The process of claim 13, wherein the polybenzodifuran ladder polymer includes a benzodifuran-quinoxaline repeat unit.

19. A process comprising:
mixing a polybenzodifuran ladder polymer with an n-type material, a p-type material, or a combination thereof, to form a blend; and
utilizing the blend to form an active layer of an organic photovoltaic device.

20. The process of claim 19, wherein the polybenzodifuran ladder polymer includes a benzodifuran-dicyclopentadienone repeat unit, a benzodifuran-pyrrole repeat unit, a benzodifuran-dione repeat unit, or benzodifuran-quinoxaline repeat unit.

* * * * *